United States Patent [19]
Tanikawa

[11] Patent Number: 5,479,423
[45] Date of Patent: Dec. 26, 1995

[54] METHOD OF MODULATING FEEDBACK SIGNAL IN OPTICAL AMPLIFIER TO COMPENSATE FOR PUMP LASER SATURATION

[75] Inventor: Kazuyuki Tanikawa, Kawasaki, Japan

[73] Assignee: Fujitsu Limited, Kanagawa, Japan

[21] Appl. No.: 189,038

[22] Filed: Jan. 31, 1994

[30]  Foreign Application Priority Data

Sep. 20, 1993 [JP] Japan ................................ 5-233637

[51] Int. Cl.⁶ .................... H01S 3/131; H01S 3/0941; H04B 10/17
[52] U.S. Cl. .................... 372/26; 372/31; 372/33; 372/38; 359/337; 359/341; 359/345
[58] Field of Search ................... 372/26, 33, 31, 372/38; 359/337, 341, 345

[56]  References Cited

U.S. PATENT DOCUMENTS

| | | | |
|---|---|---|---|
| 5,138,621 | 8/1992 | Goto et al. | 372/38 |
| 5,268,786 | 12/1993 | Matsushita et al. | 359/341 |
| 5,268,916 | 12/1993 | Slawson et al. | 392/26 |

FOREIGN PATENT DOCUMENTS

| | | |
|---|---|---|
| 0352021 | 1/1990 | European Pat. Off. . |
| 0415438 | 3/1991 | European Pat. Off. . |
| 552937 | 7/1993 | European Pat. Off. . |
| 2674071 | 9/1992 | France . |
| 5095156 | 4/1993 | Japan . |
| 2245757 | 1/1992 | United Kingdom . |
| 2254480 | 10/1992 | United Kingdom . |
| 2264835 | 9/1993 | United Kingdom . |

*Primary Examiner*—Rodney B. Bovernick
*Assistant Examiner*—Robert McNutt

[57] ABSTRACT

In a of modulating a feedback signal in an optical amplifier, employing a laser diode LD, which can directly amplify an optical signal, the amplified optical signal is modulated by the feedback signal SV which is controlled in such a way as to compensate for the saturation characteristics of the laser diode LD to correctly modulate the feedback signal even if the laser diode is nearly saturated due to aging or fluctuations in temperature.

9 Claims, 5 Drawing Sheets

BIAS CURRENT TO LASER DIODE

DETERIORATION (TEMPERATURE)

OUTPUT POWER

DETERIORATION (TEMPERATURE)

METHOD OF MODULATING FEEDBACK SIGNAL IN OPTICAL AMPLIFIER TO COMPENSATE FOR PUMP LASER SATURATION

BACKGROUND OF THE INVENTION

1. Field of the Invention

The present invention relates to a method of modulating a feedback signal in an optical amplifier and, more particularly, to a method of modulating a feedback signal in an optical amplifier which employs a laser diode which can directly amplify light.

Optical amplifiers in practical use directly amplify light by applying excitation light to an erbium-doped fiber. It is necessary for these optical amplifiers to provide a method of correctly modulating a feedback signal (a supervisory signal) even if the characteristics of a laser diode deteriorate due to aging or changes in temperature.

2. Description of Prior Art

FIG. 3 is a block diagram showing a conventional optical amplifier, employing a laser diode, which can directly amplify light. This optical amplifier may serve as a repeater of a submarine cable. In FIG. 3, reference numeral 1 designates an optical multiplexer, 2 is an optical branching filter, 3 is a photodiode (PD), 4 is an automatic level controller (ALC), 5 is a band-pass filter (BPF), and 6 is a supervisory circuit.

Reference numeral 71 denotes a first drive circuit, 72 is a second drive circuit, 81 is a first laser diode, 82 is a second laser diode, 9 is a polarization coupler, and 10 is an erbium-doped fiber (EDF). The first drive circuit 71 and the first laser diode 81 are normally used, and the second drive circuit 72 and second laser diode 82 are spare elements. The first drive circuit 71 is coupled to a first laser diode 81 which is, in turn, coupled to a polarization coupler 9. Reference numeral 82 designates a second laser diode.

In the optical amplifier of FIG. 3, the erbium-doped fiber 10 transmits light. Part of the light is filtered out by the optical branching filter 2 and is converted into an electrical signal by the photodiode 3. The automatic level controller 4 controls the output light of the laser diode 81 or 82 through the drive circuit 71 or 72, such that the photodiode 3 provides a constant output corresponding to the output power of the optical amplifier. The output light of the laser diode 81 or 82 is supplied to the erbium-doped fiber 10 through the polarization coupler 9 and optical multiplexer 1, as shown by arrows.

FIGS. 5(a) and 5(b) are graphs explaining the compensation for the deterioration of the characteristics of the laser diode of the amplifier. FIG. 5(a) shows the relationship between the deterioration of the characteristics of the laser diode due to temperature fluctuations and aging and a bias current flowing to the laser diode controlled by the automatic level controller 4, and FIG. 5(b) shows the relationship between the deterioration of the characteristics of the laser diode due to temperature fluctuations and aging and the output power of the optical amplifier excited by the laser diode driven by the bias current controlled by the automatic level controller 4 of FIG. 3.

When the characteristics of the optical amplifier deteriorate due to aging or changes in temperature, the automatic level controller 4 monitors the strength of light in the erbium-doped fiber 10 through the optical branching filter 2 and photodiode 3 and controls the bias current flowing to the laser diode 81 (82), as shown in FIG. 5(a). Namely, when the characteristics of the optical amplifier deteriorate due to increased temperature or aging, the bias current applied to the laser diode 81 (82) is increased to maintain the output power of the optical amplifier at a constant level as shown in FIG. 5(b).

Referring back to FIG. 3, the output of the photodiode 3 is also supplied to the band-pass filter 5, which filters a predetermined band of the output, to provide a supervisory signal (SV). The supervisory signal is supplied to the supervisory circuit 6 to carry out predetermined control. The supervisory circuit 6 monitors, e.g., the conditions of a repeater of a submarine cable. The supervisory signal representing the result of monitoring is transmitted to a station by modulating the amplitude of a main signal by a drive circuit (a superimpose circuit) according to the supervisory signal SV.

SUMMARY OF THE INVENTION

The problems to be solved by the method of the present invention will be now explained.

As explained above, a feedback signal (a supervisory signal) from, e.g., a repeater of a submarine cable is transferred to a land station by modulating the amplitude of the feedback signal and superimposing the modulated signal on excitation light in order to modulate the amplitude of a main signal.

FIG. 4 shows the saturation of a laser diode of an optical amplifier.

As shown in FIG. 4, the output characteristics of the laser diode 81 (82) deteriorate due to aging or fluctuations in temperature. If the laser diode deteriorates and is saturated, an output waveform of the diode will be deformed even if a large current is applied to the laser diode.

If the laser diode deteriorates and is nearly saturated due to aging or fluctuations in temperature, the optical amplifier will provide an insufficient output (amplitude). In this case, a feedback signal from the repeater of the submarine cable will not be correctly transferred to the land station. It has been, therefore, a long time need to solve this problem.

Thus, it is an object of the present invention to overcome the above disadvantage and to correctly modulate the feedback signal even if the laser diode is saturated due to aging or changes in temperature. Another object of the present invention is to correctly modulate the feedback signal even if the laser diode is saturated when a current to the laser diode is increased to keep the output power of the optical amplifier constant in response to temperature and other factors.

These and other objects are obtained by a method of modulating a feedback signal SV derived from the amplified optical signal of an optical amplifier employing a laser diode LD, which directly amplifies an optical signal, by controlling the feedback signal SV so as to compensate for the effect of the saturation characteristics of the laser diode LD.

The method of modulating the feedback signal SV in the optical amplifier according to the present invention controls the feedback signal so as to compensate for the effect of the deterioration of the characteristics of the laser diode LD. Namely, this method correctly modulates the feedback signal even if the laser diode is nearly saturated due to aging or fluctuations in temperature.

A method of modulating a feedback signal in an optical amplifier according to an embodiment of the present invention will be now explained with reference to the drawings.

DETAILED DESCRIPTION OF THE PREFERRED EMBODIMENTS

Similar references will be used for similar structural components in all figures of the drawings.

Figure 1:
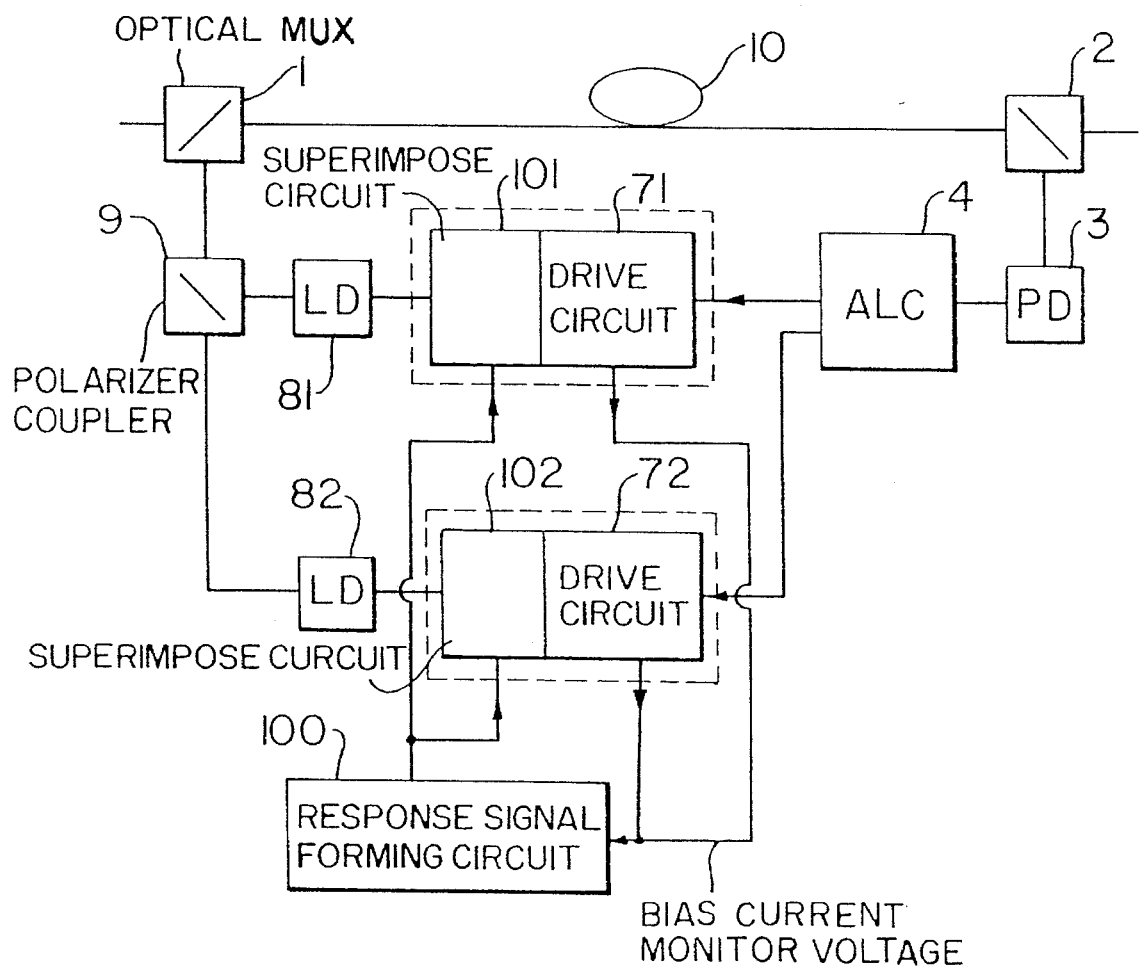
FIG. 1 is a block diagram showing an optical amplifier serving as a repeater employing a feedback or response signal modulation method according to the present invention.
Figure 3:
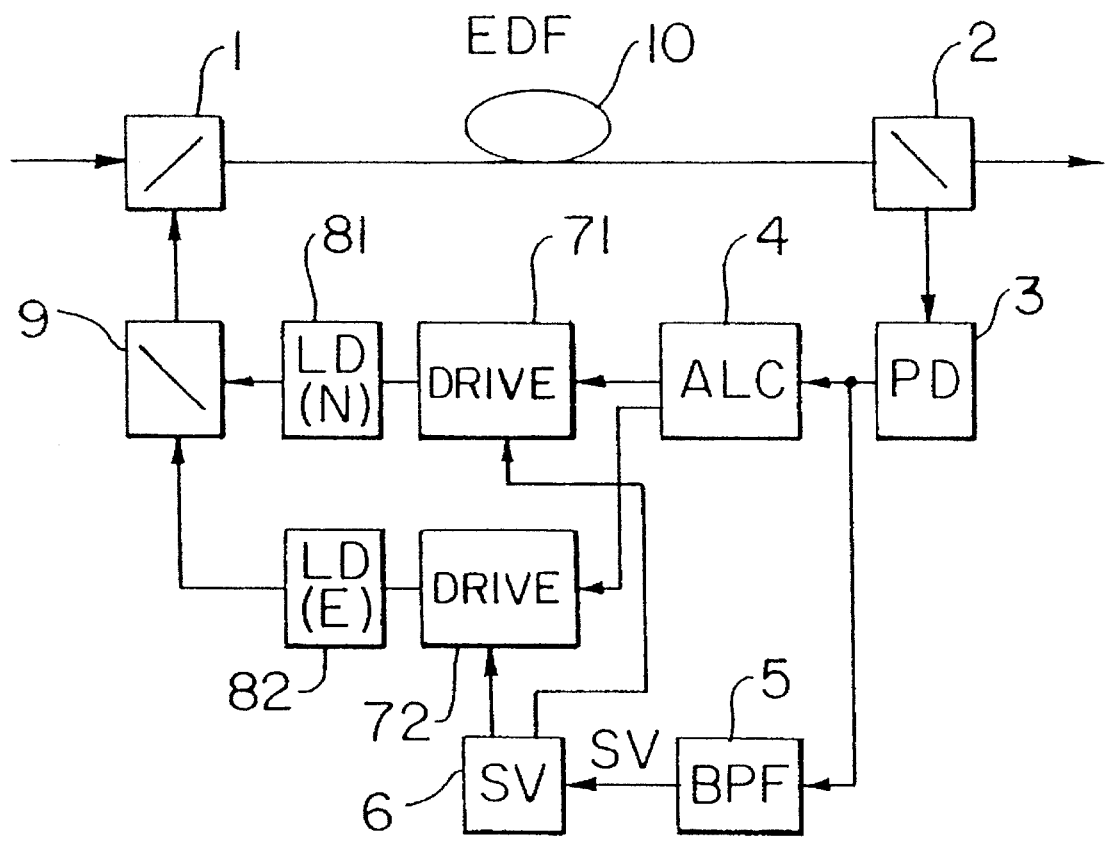
FIG. 3 is a block diagram showing a conventional optical amplifier, employing a laser diode, which can directly amplify light.

FIG. 1 is a block diagram showing an optical amplifier serving as a repeater of a submarine cable, employing the method of modulating a feedback signal according to the present invention. In FIG. 1, 1 is an optical multiplexer, 2 is an optical branching filter, 3 is a photodiode (PD), 4 is an automatic level controller (ALC), 9 is a polarization coupler, and 10 is an erbium-doped fiber (EDF). Reference numeral 71 designates a first drive circuit, 72 is a second drive circuit, 101 is a first superimpose circuit, 102 is a second superimpose circuit, 81 is a first laser diode, 82 is a second laser diode, and 100 is a feedback (response) signal forming circuit. The first drive circuit 71, first superimpose circuit 101, and first laser diode 81 are normally used. The second drive circuit 72, second superimpose circuit 102, and second laser diode 83 are spare elements. In FIG. 1, the band-pass filter (BPF) 5 and the supervisory circuit 6 of FIG. 3 are not shown.

In the optical amplifier of FIG. 1, the erbium-doped fiber 10 transmits light. Part of the light is filtered out by the optical branching filter 2 and is converted into an electric signal by the photodiode 3. The automatic level controller 4 controls the light output of the laser diode 81 (82) through the drive circuit 71 (72) such that the output of the photodiode 3 corresponding to the output power of the optical amplifier becomes constant. The output light of the laser diode 81 (82) is supplied to the erbium-doped fiber 10 through the polarization coupler 9 and optical multiplexer 1.

Each drive circuit 71, 72 is connected to the feedback signal forming circuit 100 to provide the latter with a bias current monitor voltage. According to the voltage, the feedback signal forming circuit 100 recognizes the value of a bias current in the drive circuit 71 (72) controlled by the automatic level controller 4. According to the value of the bias current in the drive circuit 71 (72), the feedback signal forming circuit 100 controls the superimpose circuit 101 (102) to control the feedback signal (supervisory signal) SV to be superimposed on a main signal. The feedback signal represents a result of monitoring the conditions of a repeater of a submarine cable and is transferred to a land station. For example, the superimpose circuit 101 (102) modulates the main signal with the amplitude of the feedback signal, and the signal is transferred to the land station.

Figure 4:
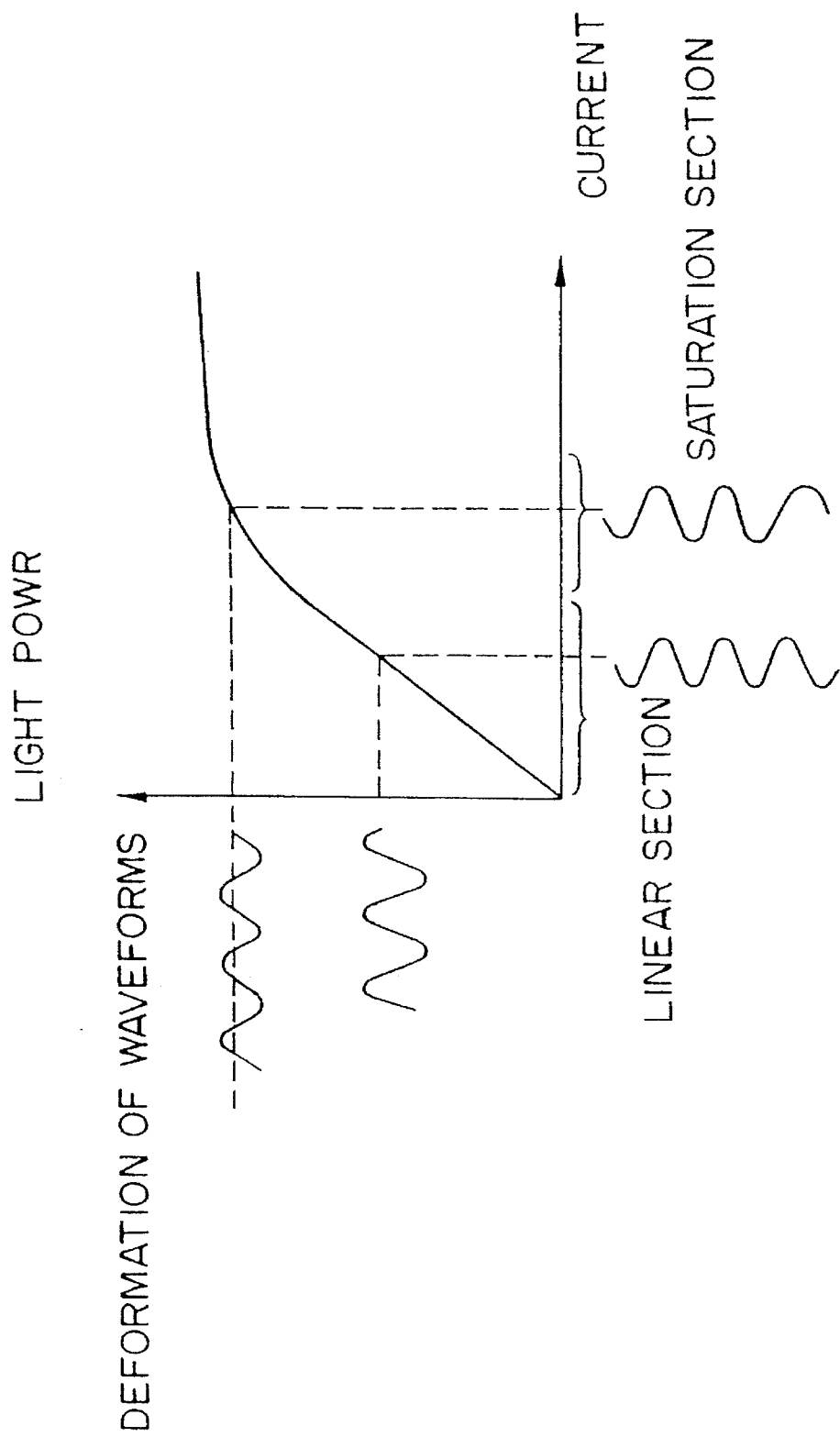
FIG. 4 is a graph which explains the saturation characteristics of a laser diode in an optical amplifier.
Figure 5A:
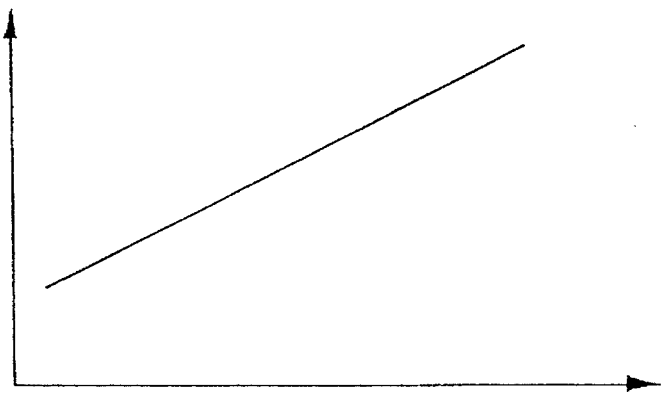
FIGS. 5a and 5b show graphs which explain the compensation of the deterioration of the characteristics of the laser diode of the optical amplifier.
Figure 5B:
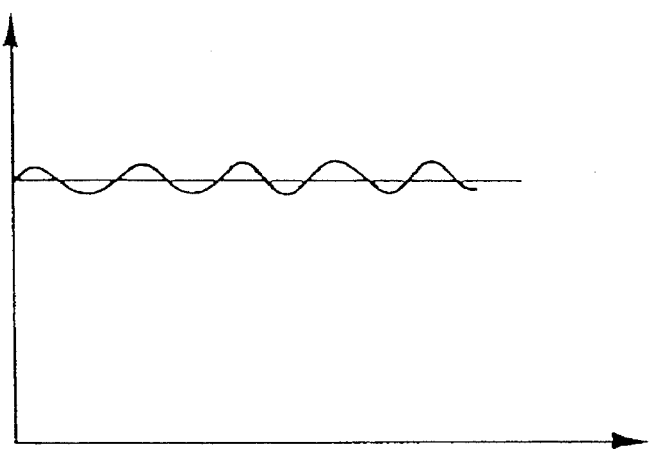

The method according to the present invention increases the amplitude of the feedback signal step by step according to the deterioration of the characteristics of the laser diode 81 (82) when modulating an optical signal provided by the laser diode 81 (82) with the feedback signal. More specifically, the feedback signal forming circuit 100 recognizes the value of a bias current in the drive circuit 71 (72), and the superimpose circuit 101 (102) controls the amplitude of the feedback signal SV in two steps corresponding to the linear and saturation sections of the characteristic curve of the laser diode (FIG. 4) to thereby modulate the amplitude of a main signal with the feedback signal SV. Namely, to allow the laser diode 81 (82) to provide a constant output, the degree of modulation by the feedback signal SV achieved by the superimpose circuit 101 (102) when the bias current (drive current) is in the linear section of the characteristic curve of FIG. 4, is controlled to be smaller than that achieved when the bias current is in the saturation section of the characteristic curve.

Alternatively, the feedback signal forming circuit 100 recognizes the value of the bias current in the drive circuit 71 (72), and as the value of the bias current in the drive circuit 71 (72) increases, the amplitude of the feedback signal SV is gradually continuously increased, and the superimpose circuit 101 (102) modulates the main signal with the amplitude of the feedback signal SV.

In this way, the feedback signal is correctly superimposed on the main signal even if the laser diode is becoming saturated a deteriorated due to aging or changes in temperature.

Figure 2A:
FIGS. 2a and 2b show waveforms explaining the feedback signal modulation method for the optical amplifier according to the present invention.
Figure 2B:
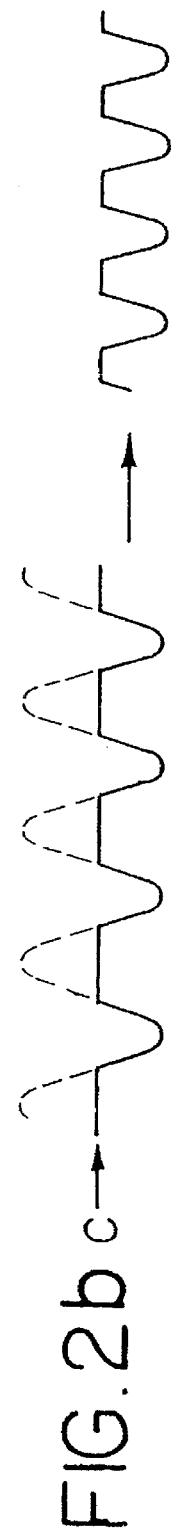

FIGS. 2(a) and 2(b) show waveforms for explaining the feedback signal modulation method according to the present invention. In FIG. 2(a), the period of the feedback signal on a saturation side (A) is longer than the normal length (B). In FIG. 2(b), the original sine curve of the feedback signal is cut at a predetermined level C.

The characteristics of the laser diode 81 (82) deteriorate due to aging or fluctuations in temperature. In consideration of such saturation characteristics of the laser diode, the feedback signal modulation method according to the present invention controls the feedback signal (SV) so as to compensate for the effect of the saturation characteristics of the laser diode 81 (82). Namely, the feedback signal is modulated to compensate for the decrease in the amplitude of the feedback signal due to the saturation characteristics of the laser diode 81 (82).

More precisely, as shown in FIG. 2(a), the period (A) of the feedback signal (SV) on a saturation side (positive side) is controlled to be longer than the original period of the feedback signal or than the period (B) of the feedback signal on an unsaturated side (negative side), to compensate for the effect of a decrease in the amplitude of the feedback signal due to the saturation characteristics of the laser diode 81 (82).

Alternatively, as shown in FIG. 2(b), the feedback signal (SV) is controlled such that the original sine curve of the feedback signal is cut at a predetermined level C on the saturation side. In this case, a half-wave rectifier may be employed to cut the feedback signal (SV) at the predetermined level on the saturation side of the characteristic curve of the laser diode 81 (82).

As a result, the feedback signal is correctly superimposed on (modulated to) the main signal even if the laser diode is nearly saturated due to aging or fluctuations in temperature.

As explained above in detail, the method of modulating a feedback signal in an optical amplifier according to the present invention controls the feedback signal to compensate for the effect of saturation characteristics of a laser diode, to thereby correctly modulate the feedback signal even if the laser diode is nearly saturated due to aging or changes in temperature. The feedback signal modulation method according to the present invention correctly modulates the feedback signal even if the laser diode is nearly saturated when a current to the laser diode is increased to keep the output power of the optical amplifier constant with respect to temperature and other factors.

What is claimed is:

1. A method of modulating a feedback signal to an optical amplifier, said amplifier including a laser diode and a driver means for driving said laser diode, said amplifier directly amplifying an optical signal, comprising the steps:
   (a) receiving a feedback signal from a remote station, said feedback signal being derived from said amplified optical signal;
   (b) determining a degree of saturation corresponding to a non-linear region of a characteristic of said laser diode by detecting an operating bias current thereof;
   (c) controlling the modulation of said feedback signal in accordance with said determined degree of laser diode saturation; and
   (d) inputting said modulated feedback signal onto said driver means so as to superimpose said feedback signal on a steady state output of said amplified optical output, said feedback signal being controlled in step (c) to compensate for said determined degree of saturation.

2. A method of modulating a feedback signal according to claim 1, wherein said feedback signal is controlled such that an original sine wave of the feedback signal is cut at a predetermined level.

3. A method of modulating a feedback signal according to claim 2, wherein the feedback signal is cut at a predetermined level with a half-wave rectifier.

4. A method of modulating a feedback signal according to claim 1, wherein said controlling step (c) includes increasing an amplitude of the feedback signal in steps in response to said determined bias current supplied to the laser diode.

5. A method of modulating a feedback signal according to claim 1 herein the optical amplifier directly amplifies light by applying excitation light to an erbium-doped fiber.

6. A method of modulating a feedback signal according to claim 1, wherein the optical amplifier serves as a repeater for a submarine cable, and the feedback signal is a supervisory signal that represents monitored conditions of the repeater.

7. A method of modulating a feedback signal to an optical amplifier, said amplifier including a laser diode and a driver means for driving said laser diode, said amplifier directly amplifying an optical signal, comprising the steps:
   (a) receiving a feedback signal from a remote station, said feedback signal being derived from said amplified optical signal;
   (b) determining a degree of saturation of said laser diode by detecting an operating bias current thereof;
   (c) controlling the modulation of said feedback signal in accordance with said determined degree of laser diode saturation; and
   (d) inputting said modulated feedback signal onto said driver means so as to superimpose said feedback signal on a steady state output of said amplified optical output, said feedback signal being controlled in step (c) to compensate for said determined degree of saturation,
   wherein in said controlling step (c) a period of the feedback signal, when the laser diode operates in a non-linear region near saturation, is longer than a normal period, to compensate for a decrease in the amplitude of the feedback signal due to said non-linearity of the laser diode.

8. A method of modulating a feedback signal to an optical amplifier, said amplifier including a laser diode and a driver means for driving said laser diode, said amplifier directly amplifying an optical signal, comprising the steps:
   (a) receiving a feedback signal from a remote station, said feedback signal being derived from said amplified optical signal;
   (b) determining a degree of saturation of said laser diode by detecting an operating bias current thereof;
   (c) controlling the modulation of said feedback signal in accordance with said determined degree of laser diode saturation; and
   (d) inputting said modulated feedback signal onto said driver means so as to superimpose said feedback signal on a steady state output of said amplified optical output, said feedback signal being controlled in step (c) to compensate for said determined degree of saturation,
   wherein said controlling step (c) includes increasing an amplitude of the feedback signal in response to said determined bias current supplied to the laser diode, and the amplitude of the feedback signal to be modulated is controlled in two steps corresponding to operation of the laser diode in the linear section or saturation section of the characteristics of the laser diode, respectively, based upon said determined bias current.

9. A method of modulating a feedback signal to an optical amplifier, said amplifier including a laser diode and a driver means for driving said laser diode, said amplifier directly amplifying an optical signal, comprising the steps:
   (a) receiving a feedback signal from a remote station, said feedback signal being derived from said amplified optical signal;
   (b) determining a degree of saturation corresponding to a non-linear region of a characteristic of said laser diode by detecting an operating bias current thereof;
   (c) controlling the modulation of said feedback signal in accordance with said determined degree of laser diode saturation; and
   (d) inputting said modulated feedback signal onto said driver means so as to superimpose said feedback signal on a steady state output of said amplified optical output, said feedback signal being controlled in step (c) to compensate for said determined degree of saturation,
   wherein in said controlling step (c) the amplitude of the feedback signal is continuously increased in response to said determined bias current to be supplied to the laser diode. corresponding to a non-linear region of a characteristic

* * * * *